United States Patent
Gao et al.

(10) Patent No.: US 12,482,776 B2
(45) Date of Patent: *Nov. 25, 2025

(54) METAL PADS OVER TSV

(71) Applicant: ADEIA SEMICONDUCTOR BONDING TECHNOLOGIES INC., San Jose, CA (US)

(72) Inventors: Guilian Gao, San Jose, CA (US); Bongsub Lee, Santa Clara, CA (US); Gaius Gillman Fountain, Jr., Youngsville, NC (US); Cyprian Emeka Uzoh, San Jose, CA (US); Laura Wills Mirkarimi, Sunol, CA (US); Belgacem Haba, Saratoga, CA (US); Rajesh Katkar, Milpitas, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 18/582,312

(22) Filed: Feb. 20, 2024

(65) Prior Publication Data
US 2024/0194625 A1 Jun. 13, 2024

Related U.S. Application Data

(63) Continuation of application No. 17/836,840, filed on Jun. 9, 2022, now Pat. No. 11,955,445, which is a
(Continued)

(51) Int. Cl.
*H01L 23/00* (2006.01)
*H01L 21/768* (2006.01)
(Continued)

(52) U.S. Cl.
CPC ........ *H01L 24/08* (2013.01); *H01L 21/76898* (2013.01); *H01L 23/481* (2013.01);
(Continued)

(58) Field of Classification Search
CPC . H04L 24/08; H04L 21/76898; H04L 23/481; H04L 24/03; H04L 24/05;
(Continued)

(56) References Cited

U.S. PATENT DOCUMENTS

| | | | |
|---|---|---|---|
| 4,612,083 | A | 9/1986 | Yasumoto et al. |
| 4,818,728 | A | 4/1989 | Rai et al. |

(Continued)

FOREIGN PATENT DOCUMENTS

| | | | |
|---|---|---|---|
| CN | 101335261 | A | 12/2008 |
| CN | 102194705 | A | 9/2011 |

(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.

(Continued)

*Primary Examiner* — Britt D Hanley
*Assistant Examiner* — Victor V Barzykin
(74) *Attorney, Agent, or Firm* — Knobbe, Martens, Olson & Bear, LLP

(57) ABSTRACT

Representative techniques and devices including process steps may be employed to mitigate the potential for delamination of bonded microelectronic substrates due to metal expansion at a bonding interface. For example, a metal pad having a larger diameter or surface area (e.g., oversized for the application) may be used when a contact pad is positioned over a TSV in one or both substrates.

13 Claims, 10 Drawing Sheets

Related U.S. Application Data continuation of application No. 16/439,622, filed on Jun. 12, 2019, now Pat. No. 11,393,779.

(60) Provisional application No. 62/846,081, filed on May 10, 2019, provisional application No. 62/684,505, filed on Jun. 13, 2018.

(51) Int. Cl.
  *H01L 23/48* (2006.01)
  *H01L 25/00* (2006.01)
  *H01L 25/065* (2023.01)

(52) U.S. Cl.
  CPC .............. *H01L 24/03* (2013.01); *H01L 24/05* (2013.01); *H01L 24/06* (2013.01); *H01L 24/09* (2013.01); *H01L 24/80* (2013.01); *H01L 25/0657* (2013.01); *H01L 25/50* (2013.01); *H01L 24/94* (2013.01); *H01L 2224/05147* (2013.01); *H01L 2224/05181* (2013.01); *H01L 2224/05184* (2013.01); *H01L 2224/08146* (2013.01); *H01L 2224/80896* (2013.01)

(58) Field of Classification Search
  CPC ......... H04L 24/06; H04L 24/09; H04L 24/80; H04L 25/0657; H04L 25/50; H04L 24/94; H04L 2224/05147; H04L 2224/01581; H04L 2224/05184; H04L 2224/08146; H04L 2224/80896; H04L 2224/034; H04L 2224/03616; H04L 2224/04; H04L 2224/05166; H04L 2224/05186; H04L 2224/05555; H04L 2224/05557; H04L 2224/05567; H04L 2224/05571; H04L 2224/05647; H04L 2224/0603; H04L 2224/06131; H04L 2224/0807; H04L 2224/08111; H04L 2224/09517; H04L 2224/8034; H04L 2224/80345; H04L 2224/80895; H04L 2224/80906; H04L 2224/80948; H04L 2224/80986; H04L 2224/94; H04L 2225/06513; H04L 2225/06541; H04L 2225/06565; H04L 2225/06593; H04L 2224/0346; H04L 2224/05009; H04L 2224/0557; H04L 2224/09519; H04L 2924/3511; H04L 23/49827; H04L 23/5226

See application file for complete search history.

(56) References Cited

U.S. PATENT DOCUMENTS

| | | | |
|---|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,385,283 B2 * | 6/2008 | Wu ........................ H01L 24/83 257/691 |
| 7,387,944 B2 | 6/2008 | Tong et al. |
| 7,485,968 B2 | 2/2009 | Enquist et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |

(56) References Cited

U.S. PATENT DOCUMENTS

| | | |
|---|---|---|
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,040,385 B2 | 5/2015 | Chen et al. |
| 9,064,937 B2 | 6/2015 | Edelstein et al. |
| 9,082,627 B2 | 7/2015 | Tong et al. |
| 9,082,644 B2 | 7/2015 | Ossimitz et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,032 B2 | 5/2016 | Liu et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,343,369 B2 | 5/2016 | Du et al. |
| 9,368,866 B2 | 6/2016 | Yu |
| 9,385,024 B2 | 7/2016 | Tong et al. |
| 9,394,161 B2 | 7/2016 | Cheng et al. |
| 9,425,155 B2 | 8/2016 | Liu et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 * | 10/2016 | Chun .................. H01L 24/80 |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,859,254 B1 | 1/2018 | Yu et al. |
| 9,865,581 B2 | 1/2018 | Jang et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,129 B2 | 5/2018 | Liu et al. |
| 9,960,142 B2 | 5/2018 | Chen et al. |
| 9,991,244 B2 * | 6/2018 | Lin .................. H01L 23/481 |
| 10,002,844 B1 | 6/2018 | Wang et al. |
| 10,026,605 B2 | 7/2018 | Doub et al. |
| 10,075,657 B2 | 9/2018 | Fahim et al. |
| 10,103,122 B2 | 10/2018 | Liu et al. |
| 10,147,641 B2 | 12/2018 | Enquist et al. |
| 10,204,893 B2 | 2/2019 | Uzoh et al. |
| 10,211,166 B2 | 2/2019 | Matsuo |
| 10,269,708 B2 | 4/2019 | Enquist et al. |
| 10,269,756 B2 | 4/2019 | Uzoh |
| 10,269,778 B2 | 4/2019 | Lin et al. |
| 10,276,619 B2 | 4/2019 | Kao et al. |
| 10,276,909 B2 | 4/2019 | Huang et al. |
| 10,312,275 B2 | 6/2019 | Hynecek |
| 10,418,277 B2 | 9/2019 | Cheng et al. |
| 10,431,614 B2 | 10/2019 | Gambino et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,707,087 B2 | 7/2020 | Uzoh et al. |
| 10,790,262 B2 | 9/2020 | Uzoh et al. |
| 10,796,913 B2 | 10/2020 | Lin |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,393,779 B2 | 7/2022 | Gao et al. |
| 11,728,313 B2 | 8/2023 | Lee et al. |
| 11,749,645 B2 | 9/2023 | Gao et al. |
| 11,955,445 B2 * | 4/2024 | Gao .................. H01L 24/08 |
| 12,205,926 B2 | 1/2025 | Gao et al. |
| 12,243,851 B2 | 3/2025 | Lee et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2002/0113241 A1 | 8/2002 | Kubota et al. |
| 2003/0092220 A1 | 5/2003 | Akram |
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2004/0084414 A1 | 5/2004 | Sakai et al. |
| 2004/0157407 A1 | 8/2004 | Tong et al. |
| 2004/0217483 A1 | 11/2004 | Hedler et al. |
| 2004/0262772 A1 | 12/2004 | Ramanathan et al. |
| 2005/0104224 A1 | 5/2005 | Huang et al. |
| 2005/0181542 A1 | 8/2005 | Enquist |
| 2006/0024950 A1 | 2/2006 | Choi et al. |
| 2006/0057945 A1 | 3/2006 | Hsu et al. |
| 2007/0096294 A1 | 5/2007 | Ikeda et al. |
| 2007/0111386 A1 | 5/2007 | Kim et al. |
| 2007/0117348 A1 | 5/2007 | Ramanathan et al. |
| 2007/0145367 A1 | 6/2007 | Chen et al. |
| 2007/0212870 A1 | 9/2007 | Yang et al. |
| 2007/0222048 A1 | 9/2007 | Huang |
| 2007/0295456 A1 | 12/2007 | Gudeman et al. |

(56) References Cited

U.S. PATENT DOCUMENTS

| | | |
|---|---|---|
| 2007/0296073 A1* | 12/2007 | Wu .............. H01L 21/6835 438/109 |
| 2008/0006938 A1 | 1/2008 | Patti et al. |
| 2008/0122092 A1 | 5/2008 | Hong |
| 2008/0142990 A1 | 6/2008 | Yu et al. |
| 2009/0001598 A1 | 1/2009 | Chiou et al. |
| 2009/0108469 A1 | 4/2009 | Kang et al. |
| 2009/0197408 A1 | 8/2009 | Lehr et al. |
| 2009/0200668 A1 | 8/2009 | Yang et al. |
| 2010/0130003 A1 | 5/2010 | Lin et al. |
| 2010/0164066 A1 | 7/2010 | Di Franco |
| 2011/0074040 A1 | 3/2011 | Frank et al. |
| 2011/0290552 A1 | 12/2011 | Palmateer et al. |
| 2012/0074581 A1 | 3/2012 | Guzek et al. |
| 2012/0168935 A1* | 7/2012 | Huang ............ H01L 21/6835 438/455 |
| 2012/0171818 A1 | 7/2012 | Barth et al. |
| 2012/0211894 A1 | 8/2012 | Aoyagi |
| 2012/0212384 A1 | 8/2012 | Kam et al. |
| 2012/0241981 A1 | 9/2012 | Hirano |
| 2012/0319280 A1 | 12/2012 | Suganuma et al. |
| 2013/0020704 A1 | 1/2013 | Sadaka |
| 2013/0075900 A1 | 3/2013 | Shim et al. |
| 2013/0154112 A1 | 6/2013 | Zhang et al. |
| 2013/0161824 A1 | 6/2013 | Choi et al. |
| 2013/0187287 A1 | 7/2013 | Park et al. |
| 2013/0221527 A1 | 8/2013 | Yang et al. |
| 2013/0256913 A1 | 10/2013 | Black et al. |
| 2013/0284885 A1 | 10/2013 | Chen et al. |
| 2013/0320556 A1* | 12/2013 | Liu .............. H01L 24/92 438/455 |
| 2013/0328186 A1 | 12/2013 | Uzoh et al. |
| 2014/0065738 A1 | 3/2014 | Bhoovaraghan et al. |
| 2014/0131869 A1 | 5/2014 | Pendse |
| 2014/0145338 A1 | 5/2014 | Fujii et al. |
| 2014/0175614 A1 | 6/2014 | Wang et al. |
| 2014/0175655 A1 | 6/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0064498 A1 | 3/2015 | Tong |
| 2015/0097022 A1 | 4/2015 | Di Cioccio et al. |
| 2015/0108644 A1 | 4/2015 | Kuang et al. |
| 2015/0137325 A1 | 5/2015 | Hong et al. |
| 2015/0155263 A1 | 6/2015 | Farooq et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2015/0357296 A1 | 12/2015 | Liu et al. |
| 2015/0364434 A1 | 12/2015 | Chen et al. |
| 2015/0380341 A1 | 12/2015 | Chiou et al. |
| 2016/0086923 A1 | 3/2016 | Best |
| 2016/0181228 A1 | 6/2016 | Higuchi et al. |
| 2016/0190103 A1 | 6/2016 | Tatsuya et al. |
| 2016/0322414 A1 | 11/2016 | Chen et al. |
| 2016/0343682 A1 | 11/2016 | Kawasaki |
| 2017/0053897 A1 | 2/2017 | Lai et al. |
| 2017/0062366 A1 | 3/2017 | Enquist |
| 2017/0110388 A1 | 4/2017 | Park et al. |
| 2017/0179029 A1 | 6/2017 | Enquist et al. |
| 2017/0194271 A1 | 7/2017 | Hsu et al. |
| 2017/0213792 A1 | 7/2017 | Nag et al. |
| 2017/0250160 A1 | 8/2017 | Wu et al. |
| 2017/0330859 A1 | 11/2017 | Soares et al. |
| 2017/0358551 A1 | 12/2017 | Liu et al. |
| 2018/0012869 A1 | 1/2018 | Sadaka |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0204868 A1 | 7/2018 | Kao et al. |
| 2018/0219038 A1 | 8/2018 | Gambino et al. |
| 2018/0226371 A1 | 8/2018 | Enquist |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0057756 A1 | 2/2019 | Kim et al. |
| 2019/0088535 A1 | 3/2019 | Yan et al. |
| 2019/0096741 A1 | 3/2019 | Uzoh et al. |
| 2019/0096842 A1 | 3/2019 | Fountain, Jr. et al. |
| 2019/0109042 A1 | 4/2019 | Katkar et al. |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0189603 A1 | 6/2019 | Wang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0363079 A1* | 11/2019 | Thei .............. H01L 23/481 |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035630 A1 | 1/2020 | Kameshima |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0091063 A1* | 3/2020 | Chen .............. H01L 25/162 |
| 2020/0119137 A1 | 4/2020 | Takeuchi et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0066233 A1 | 3/2021 | Fountain, Jr. et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0257341 A1 | 8/2021 | Lee et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0005784 A1 | 1/2022 | Gao et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |

(56) References Cited

U.S. PATENT DOCUMENTS

| | | |
|---|---|---|
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0006383 A1 | 1/2024 | Lee et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0088101 A1 | 3/2024 | Gao et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |

FOREIGN PATENT DOCUMENTS

| | | |
|---|---|---|
| CN | 105140144 A | 12/2015 |
| CN | 106653720 A | 5/2017 |
| CN | 106920795 A | 7/2017 |
| CN | 107039380 A | 8/2017 |
| CN | 107731668 A | 2/2018 |
| CN | 107993927 A | 5/2018 |
| CN | 107993928 A | 5/2018 |
| CN | 109155301 A | 1/2019 |
| CN | 109417073 A | 3/2019 |
| CN | 109417075 A | 3/2019 |
| CN | 109417077 A | 3/2019 |
| CN | 109643643 A | 4/2019 |
| CN | 109844915 A | 6/2019 |
| EP | 0 465 227 A2 | 1/1992 |
| EP | 2 863 420 A1 | 4/2015 |
| JP | 61-030059 | 2/1986 |
| JP | 01-168040 | 7/1989 |
| JP | 4-259249 | 9/1992 |
| JP | 05-029183 | 2/1993 |
| JP | 5-198739 | 8/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |
| JP | 2003-023071 | 1/2003 |
| JP | 2004-200547 | 7/2004 |
| JP | 2005-086089 | 3/2005 |
| JP | 2005-093486 | 4/2005 |
| JP | 2005-135988 | 5/2005 |
| JP | 2013-033786 A | 2/2013 |
| JP | 2013-033900 A | 2/2013 |
| JP | 2013-243333 | 12/2013 |
| JP | 2018-160519 | 10/2018 |
| JP | 2019-129199 | 8/2019 |
| KR | 10-2010-0112852 | 10/2010 |
| KR | 10-2012-0106366 | 9/2012 |
| KR | 10-2015-0097798 | 8/2015 |
| TW | 476145 | 2/2002 |
| TW | 201528473 A | 7/2015 |
| WO | WO 2001/061743 A1 | 8/2001 |
| WO | WO 2003/054954 A2 | 7/2003 |
| WO | WO 2005/043584 A2 | 5/2005 |
| WO | WO 2006/100444 A1 | 9/2006 |
| WO | WO 2012/013162 A1 | 2/2012 |
| WO | WO 2012/133760 A1 | 10/2012 |
| WO | WO 2016/185883 A1 | 11/2016 |
| WO | WO 2017/151442 A1 | 9/2017 |
| WO | WO 2017/155002 A1 | 9/2017 |
| WO | WO 2018/076700 A1 | 5/2018 |
| WO | WO 2019/146427 A1 | 8/2019 |

OTHER PUBLICATIONS

Appeal Decision of Rejection issued on Apr. 12, 2016 in Japanese Patent Application No. 2008-526104, in 14 pages.

Aspar, B. et al., "The smart-cut process: Status and developments," Proc. Electrochem Soc., 1999, vol. 99-53, pp. 48-59.

Bower, R. et al., "Low temperature Si3N4 direct bonding," Appl. Phys. Lett., Jun. 28, 1993, vol. 62, No. 26, pp. 3485-3487.

Bush, Steve, "Electronica: Automotive power modules from On Semi," ElectronicsWeekly.com, indicating an ONSEMI AR0820 product was to be demonstrated at aNovember 2018 trade show,

(56) References Cited

OTHER PUBLICATIONS https://www.electronicsweekly.com/news/products/power-supplies/electronica-automotive-power-modules-semi-2018-11/ (published Nov. 8, 2018; downloaded Jul. 26, 2023).

Canadian Office Action issued Aug. 1, 2013 in Canadian Patent Application No. 2,618, 191, 4 pages.

Canadian Office Action, mailed May 16, 2012 for Canadian Patent Application No. 2,515,375, with international preliminary report, 2 pages.

Ceramic Microstructures: Control at the Atomic Level, Recent Progress in Surface Activated Bonding, 1998, pp. 385-389.

"Chemical Mechanical Polishing (CMP) Metrology with Advanced Surface Polisher," Park Systems, 4 pages.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room|temperature by the surface activated bonding method," Applied Surface Science, Jun. 2, 1997, vols. 117-118, pp. 808-812.

D'Agostino, R., "Plasma etching of Si and SiO2 in SF6—O2 mixtures," J. Appl. Phys., Jan. 1981, vol. 52, No. 1, pp. 162-167.

Decision—Request for Trail Granted, Inter Partes Review, U.S. Pat. No. 7,485,968, Case IPR2013-00381, dated Dec. 18, 2013, in 27 pages.

Declaration of Richard A. Blanchard in Support of Petition for inter partes review of U.S. Pat. No. 7,485,968, dated Jun. 13, 2013, pp. 1-18.

Derbyshire, Katherine, "The darker side of hybrid bonding," Semiconductor Engineering, Dec. 17, 2020, https://semiengineering.com/author/katherine/, 6 pages.

Dysard, Jeffrey M. et al., "CMP solutions for the integration of high-k metal gate technologies," ECS Transactions, 2010, vol. 33, Issue 10, pp. 77-89.

Extended European Search Report dated Mar. 30, 2022, European Application No. 19820162.6, 14 pages.

Fan et al., "Copper wafer bonding," Electrochem. Solid-State Lett., U.S.A., The Electrochemical Society, Aug. 6, 1999, vol. 2, No. 10, pp. 534-536.

Fang, S.J. et al., "Advanced process control in dielectric chemical mechanical polishing (CMP)," In Chemical Mechanical Polish for ULSI Multilevel Interconnection Conference Feb. 1999; 8 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Final Written Decision, Inter Partes Review, U.S. Pat. No. 7,485,968, Case IPR2013-00381, dated Feb. 27, 2014, in 3 pages.

Gösele et al., "Semiconductor Wafer Bonding: A flexible approach to materials combinations in microelectronics; micromechanics and optoelectronics," IEEE, 1997, pp. 23-32.

Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.

Handbook of Thin Film Technology, Maissel and Glang, 1983 Reissue, pp. 12-24.

Harendt, C. et al., "Vertical polysilicon interconnects by aligned wafer bonding," Electrochemical Society Proceedings, 1998, vol. 97-36, pp. 501-508.

Hayashi, Y. et al., "Fabrication of three-dimensional IC using cumulatively bonded Ic (CUBIC) technology," VSLI Tech. Dog., 1990, pp. 95-96.

Hizukuri, M. et al., "Dynamic strain and chip damage during ultrasonic flip chip bonding," Jpn. J. Appl. Phys. 40, 2001, pp. 3044-3048.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs-Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7.

Howlader et al., "Bonding of p-Si/n-InP wafers through surface activated bonding method|at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

"Hybrid Bonding—Patent Landscape Analysis," from Technologies to IP Business Intelligence, KnowMade Patent & Technology Intelligence, www.kmowmade.com, Nov. 2019, 81 pages.

Hymes, S. et al., "Determination of the planarization distance for copper CMP process," MRS Online Proceedings Library (OPL). Jan. 1999; 566:211; 6 pages.

Iida, A. et al., "The study of initial mechanism for Al—Au solid phase diffusion flip-chip bonding," Jpn. J. Appl. Phys. 40, 1997, pp. 3044-3661.

International Search Report and Written Opinion mailed Apr. 22, 2019 in International Application No. PCT/US2018/064982, 13 pages.

International Search Report and Written Opinion mailed Mar. 7, 2019, in International Application No. PCT/US2018/060044, 14 pages.

International Search Report and Written Opinion mailed Oct. 8, 2019, in International Application No. PCT/US2019/037072, 13 pages.

Itoh et al., "Characteristics of fritting contacts utilized for micromachined wafer probe cards,"|2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Jensen K. et al., "Thermal Chemical Vapor Deposition," in *Thin Film Processes II*, Vossen et al. [Eds], Chapter III-1; Academic Press Inc., 1991, 62 pages.

Juang, Jing-Ye et al., "Copper-to-copper direct bonding on highly (111)-oriented nanotwinned copper in no-vacuum ambient," Scientific Reports, Sep. 17, 2018, vol. 8, 13910 in 11 pages.

Ker, Ming-Dou et al., "Fully process-compatible layout design on bond pad to improve wirebond reliability in CMOS 1cs," IEEE Transactions on Components and Packaging Technologies, Jun. 2002, vol. 25, No. 2, pp. 309-316.

Kern W. et al., "Chemical Vapor Deposition of Inorganic Thin Films," in *Thin Film Processes*, Vossen et al. [Eds}. Chapter III-2, Academic Press, 1978, 62 pages.

Kim et al., "Low temperature direct Cu—Cu bonding with low energy ion activation method," Electronic Materials and Packaging, 2001, IEEE, pp. 193-195.

(56) References Cited

OTHER PUBLICATIONS

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—CU, Cu—Si, and Cu—SiO2 at low temperature," Proceedings—Electrochemical Society, 2003, vol. 19, pp. 239-247.

Kissinger, G. et al., "Void-free silicon-wafer-bond stregthening in the 200-400 C range," Sensors and Actuators A, 1993, vol. 36, pp. 149-156.

Krauter, G. et al., "Low temperature silicon direct bonding for application in micromechanics: bonding energies for different combinations of oxides," Sensors and Actuators A, 1998, vol. 70, pp. 271-275.

Kumar, N. et al., "Robust TSV Via-Middle and Via-Reveal Process Integration Accomplished through Characterization and Management of Sources of Variation," Electronic Components and Technology Conference (ECTC), 2012 IEEE 62nd, May 29, 2012-Jun. 1, 2012, pp. 787-793.

Kunio, Takemitsu, "Three dimensional IC technology, using cubic method," Journal of the JWS, Japan Welding Society, Apr. 5, 1994, vol. 63, No. 3, pp. 185-189.

Lee, D. et al., "Slurry components in metal chemical mechanical planarization (CMP) process: A review," International Journal of Precision Engineering and Manufacturing, Dec. 2016, vol. 17, No. 12, pp. 1751-1762.

Li, Yuzhuo, "Key factors that influence step height reduction efficiency and defectivity during metal CMP," Clarkson University, Levitronix CMP Users' Conference 2006, 2006, 32 pages.

Li, Y.A. et al., "Low temperature copper to copper direct bonding," Jpn. Appl. Phys. 37, 1998, pp. L1068-L1069.

Li, Y.A. et al., "Systematic low temperature silicon bonding using pressure and temperature," Jpn. J. Appl. Phys., vol. 37, 1998, pp. 737-741.

Liu, Zi-Yu et al. "Detection and formation mechanism of microdefects in ultrafine pitch Cu—Cu direct bonding," Chin. Phys. B, 2016, vol. 25, No. 1, pp. 018103-1-018103-7.

Liu, C. et al., "Low-temperature direct copper-to-copper bonding enabled by creep on (111) surfaces of nanotwinned Cu," Scientific Reports, May 12, 2015, 5:09734, pp. 1-11.

Lu, L. et al., "Grain growth and strain release in nanocrystalline copper," J Applied Physics, Jun. 1, 2001; vol. 89, Issue 11, pp. 6408-6414.

Luo, Ying, "Slurry Chemistry Effects On Copper Chemical Mechanical Planarization," University of Central Florida STARS, Electronic Theses and Disserations, 2004, Paper 36, 111 pages.

Matsuzawa et al., "Room-temperature interconnection of electroplated Au microbump by means of surface activated bonding method," Electornic Components and Technology Confererence, 2001, 51st Proceedings, IEEE, pp. 384-387.

Monsma et al., "Development of the spin-valve transistor," IEEE Tran. Magnet., vol. 33, No. 5, Sep. 1997, pp. 3495-3499.

Moriceau, H. et al., "Overview of recent direct wafer bonding advances and applications," Adv Nat Sciences: Nanoscience and Nanotechnology, Dec. 2010;1(4):043004; 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Mott, D. et al., "Synthesis of size-controlled and shaped copper nanoparticles, " Langmuir, 2007, vol. 23, No. 10, pp. 5740-5745.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

Onsemi AR0820 image, cross section of a CMOS image sensor product. The part in the image was shipped on Sep. 16, 2021. Applicant makes No. representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."

Ortleb, Thomas et al., "Controlling macro and micro surface topography for a 45nm copper CMP process using a high resolution profiler," Proc. Of SPIE, 2008, vol. 6922, 11 pages.

Paul, E. et al., "A model of copper CMP," J. Electrochem. Soc., 2005, vol. 152, Issue 4, pp. G322-G328.

Petition for Inter Partes Review of U.S. Pat. No. 7,485,968, IPR 2013-00381, filed Jun. 21, 2013, pp. 1-49.

Plössl, A. et al., "Wafer direct bonding: tailoring adhesion between brittle materials," Materials Science and Engineering: R: Reports. Mar. 10, 1999;25(1-2):1-88.

Reiche et al., "The effect of a plasma pretreatment on the Si/Si bonding behavior," Electrochemical Society Proceedings, 1998, vol. 97-36, pp. 437-444.

Rhoades R.L., "The dark art of CMP." Future Fab International. 2008;24: 76-85.

Roberds et al., "Low temperature, in situ, plasma activated wafer bonding," Electrochemical Society Proceedings, 1997, vol. 97-36, pp. 598-606.

Rosales-Yeomans, D. et al., "Evaluation of pad groove designs under reduced slurry flow rate conditions during copper CMP," Journal of The Electrochemical Society, 2008, vol. 155, No. 10, pp. H812-H818.

Schmidt, Martin A., Wafer-To-Wafer Bonding for Microstructure Formation, Proceedings of the IEEE, vol. 86, No. 8, 1998, pp. 1575-1586.

Shigetou et al., "Cu—Cu direct bonding for bump-less interconnect," Research Center for Advanced Science and Technolog., University of Tokyo, Optoelectronic Packaging and Solder Bumps, (2002), pp. 628-639.

Shigetou et al., "Room temperature bonding of ultra-fine pitch and low-profiled Cuelectrodes for bump-less interconnect," 2003 Electronic Components and Technology Conference, pp. 848-852.

Shigetou et al., "Room-temperature direct bonding of CMP-Cu film for bumpless interconnection," Electronic Components and Technology Conference, 51st Proceedings, 2001, IEEE, pp. 755-760.

Shimatsu, T. et al., "Metal bonding during sputter film deposition," J. Vac. Sci. Technol. A 16(4), 1998, pp. 2125-2131.

Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes norepresentation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

Steinkirchner, J. et al., Silicon wafer bonding via designed monolayers Advanced materials. Jul. 1995;7(7): 662-665.

Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

(56) References Cited

OTHER PUBLICATIONS

Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectromechanical systems, Mar. 1994, vol. 3, No. 1, pp. 29-35.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tong, Q.Y. et al., "Semiconductor wafer bonding," Materials Chemistry and Physics, R25, 1999, 239 pages (excerpts).
Tong, Q.Y. et al., "Semiconductor wafer bonding: recent developments," Materials Chemistry and Physics, vol. 37, 1994, pp. 101-127.
Tong, Q.Y. et al., "Semiconductor wafer bonding: Science and technology," John Wiley & Sons, Inc., 1999, Table of Contents, Preface in 120 pages.
Tong, Q.Y. et al., "Semiconductor wafer bonding: Science and technology," John Wiley & Sons, Inc., 1999, 159 pages.
Tong, Q.Y. et al., "Wafer bonding and layer splitting for microsystems," Advanced Materials, 1999, vol. 11, No. 17, pp. 1409-1425.
Topol et al., "Enabling technologies for wafer-level bonding of 3D MEMS and integrated circuit structures," 2004 Electronics Components and Technology Conference, 2004 IEEE, pp. 931-938.
Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold—gold thermocompression bonds," Mater. Soc. Symp. Proc. 605, 1999, pp. 171-176.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Warner, K. et al., "Low-temperature oxide-bonded three-dimensional integrated circuits," IEEE International SOI Conference, Oct. 2012, pp. 123-125.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Wikipedia, "Chemical bond," URL http://en.wikipedia.org/wiki/chemical_bond, accessed on Mar. 31, 2010, 10 pages.
Wikipedia, "Van der Waals force," URL https://en.wikipedia.org/wiki/Van_der_Waals_force, originally accessed on Mar. 31, 2010, 7 pages.
Xu et al., "New Au—Al interconnect technology and its reliability by surface activated bonding," Electronic Packaging Technology Proceedings, Oct. 28-30, 2003, Shanghai, China, pp. 479-483.
Yablonovitch, E. et al., "Van der Waals bonding of GaAs on Pd leads to a permanent, solid-phase-topotaxial metallurgical bond," Appl. Phys. Lett. 59, 1991, pp. 3159-3161.
Image showing a partial cross-section of Sony IMX260 BSI image sensor from Samsung Galaxy S7; product believed to be released Mar. 2016.
Image showing a partial cross-section of Omnivision OV16B10 16MP BSI image sensor from Huawei P20 Lite Phone; product believed to be released May 2018.
European Extended Search Report dated Jan. 20, 2025 in corresponding EP Application No. 24205704.0 in 13 pages.

\* cited by examiner

```
                                                              ┌─ 1800
```

EMBED A FIRST THROUGH SILICON VIA (TSV) INTO A FIRST SUBSTRATE HAVING A FIRST BONDING SURFACE, THE FIRST TSV NORMAL TO THE FIRST BONDING SURFACE
1802

FORM A FIRST METAL CONTACT PAD AT THE FIRST BONDING SURFACE AND ELECTRICALLY COUPLED TO THE FIRST TSV, BASED ON A VOLUME OF THE MATERIAL OF THE FIRST TSV AND A COEFFICIENT OF THERMAL EXPANSION (CTE) OF THE MATERIAL OF THE FIRST TSV, THE FIRST METAL CONTACT PAD EXTENDING PARTIALLY INTO THE FIRST SUBSTRATE BELOW THE FIRST BONDING SURFACE
1804

PLANARIZE THE FIRST BONDING SURFACE TO HAVE A PREDETERMINED MAXIMUM SURFACE VARIANCE FOR DIRECT BONDING AND THE FIRST METAL CONTACT PAD TO HAVE A PREDETERMINED RECESS RELATIVE TO THE FIRST BONDING SURFACE BASED ON THE VOLUME OF THE MATERIAL OF THE FIRST TSV AND A COEFFICIENT OF THERMAL EXPANSION (CTE) OF THE MATERIAL OF THE FIRST TSV
1806

FIG. 18

METAL PADS OVER TSV

PRIORITY CLAIM AND CROSS-REFERENCE TO RELATED APPLICATION

This application is a continuation of U.S. application Ser. No. 17/836,840, filed Jun. 9, 2022, which is a continuation of U.S. application Ser. No. 16/439,622, filed Jun. 12, 2019, issued as U.S. Pat. No. 11,393,779, which claims the priority of U.S. Provisional Application No. 62/846,081, filed May 10, 2019 and U.S. Provisional Application No. 62/684,505, filed Jun. 13, 2018, the disclosures of each of which are hereby incorporated by reference in their entireties for all purposes.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company. The bonding includes a spontaneous process that takes place at ambient conditions when two prepared surfaces are brought together (see for example, U.S. Pat. Nos. 6,864,585 and 7,485,968, which are incorporated herein in their entirety).

Respective mating surfaces of the bonded dies or wafers often include embedded conductive interconnect structures (which may be metal), or the like. In some examples, the bonding surfaces are arranged and aligned so that the conductive interconnect structures from the respective surfaces are joined during the bonding. The joined interconnect structures form continuous conductive interconnects (for signals, power, etc.) between the stacked dies or wafers.

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topology (i.e., nanometer scale variance), so that the surfaces can be closely mated to form a lasting bond.

Double-sided dies can be formed and prepared for stacking and bonding, where both sides of the dies will be bonded to other substrates or dies, such as with multiple die-to-die or die-to-wafer applications. Preparing both sides of the die includes finishing both surfaces to meet dielectric roughness specifications and metallic layer (e.g., copper, etc.) recess specifications. For instance, conductive interconnect structures at the bonding surfaces may be slightly recessed, just below the insulating material of the bonding surface. The amount of recess below the bonding surface may be determined by a dimensional tolerance, specification, or physical limitation of the device or application. The hybrid surface may be prepared for bonding with another die, wafer, or other substrate using a chemical mechanical polishing (CMP) process, or the like.

In general, when direct bonding surfaces containing a combination of a dielectric layer and one or more metal features (e.g., embedded conductive interconnect structures) are bonded together, the dielectric surfaces bond first at lower temperatures and the metal of the features expands afterwards, as the metal is heated during annealing. The expansion of the metal can cause the metal from both bonding surfaces to join into a unified conductive structure (metal-to-metal bond). While both the substrate and the metal are heated during annealing, the coefficient of thermal expansion (CTE) of the metal relative to the CTE of the substrate generally dictates that the metal expands much more than the substrate at a particular temperature (e.g., ~300° C.). For instance, the CTE of copper is 16.7, while the CTE of fused silica is 0.55, and the CTE of silicon is 2.56.

In some cases, the greater expansion of the metal relative to the substrate can be problematic for direct bonding stacked dies or wafers. If a metal pad is positioned over a through-silicon via (TSV), the expansion of the TSV metal can contribute to the expansion of the pad metal. In some cases, the combined metal expansion can cause localized delamination of the bonding surfaces, as the expanding metal rises above the bonding surface. For instance, the expanded metal can separate the bonded dielectric surfaces of the stacked dies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

FIG. 18 is a text flow diagram illustrating an example process of forming a microelectronic assembly to reduce or eliminate delamination of the bonded substrates, according to an embodiment.

SUMMARY

Figures 1A, 1B:
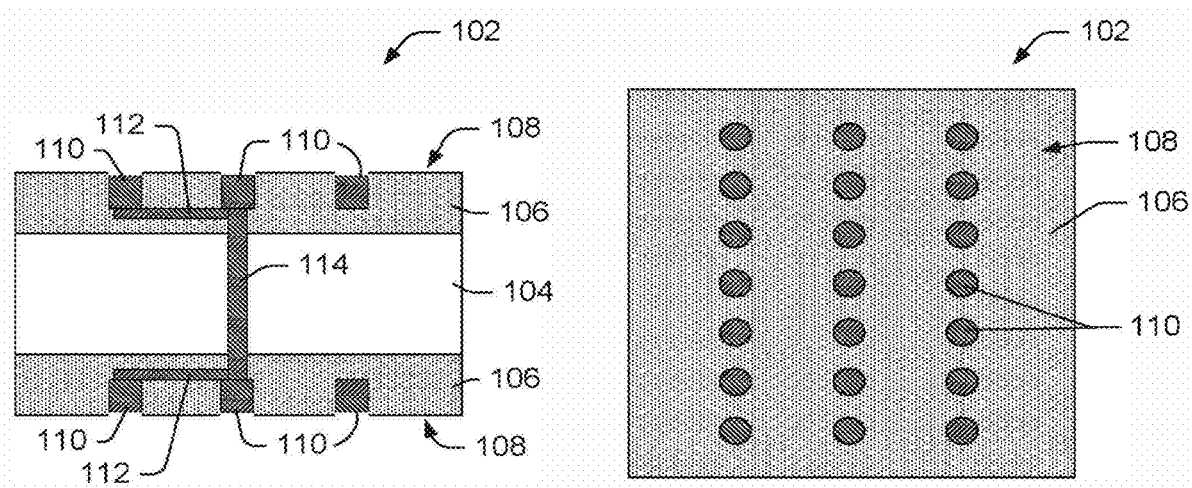
FIG. 1A shows a cross-section of an example substrate with bonding pads and a TSV.
FIG. 1B shows a top view of the example substrate of FIG. 1A.

Representative techniques and devices are disclosed, including process steps for preparing various microelectronic devices for bonding, such as for direct bonding without adhesive. In various embodiments, techniques may be employed to mitigate the potential for delamination due to metal expansion, particularly when a TSV or a bond pad over a TSV is presented at the bonding surface of one or both devices to be bonded. For example, in one embodiment, a metal pad having a larger diameter or surface area (e.g., oversized for the application) may be used when a contact pad is positioned over a TSV. For instance, the contact pad, including the size (e.g., surface area, diameter, etc.) of the contact pad, or the amount of oversize of the contact pad may be selected based on the material of the pad, its thickness, and anticipated recess during processing.

When using surface preparation processes such as CMP to prepare the bonding surface of the substrate, the metal pads on the bonding surface can become recessed relative to the dielectric, due to the softer material of the pads relative to the material of the dielectric. A larger diameter metal pad may become recessed to a greater degree (e.g., a deeper recess) than a smaller diameter pad. In an embodiment where a contact pad is positioned over a TSV, the deeper recess can compensate for a combined metal expansion of the pad and the TSV, allowing more room for expansion of the metal, which can reduce or eliminate delamination that could occur otherwise when the metal expands.

In various implementations, an example process includes embedding a first through silicon via (TSV) into a first substrate having a first bonding surface, where the first TSV is normal to the first bonding surface (i.e., vertical within a horizontally oriented substrate with a like horizontally oriented bonding surface. The process may include estimating an amount that a material of the first TSV will expand when heated to a preselected temperature, based on a volume of the material of the first TSV and a coefficient of thermal expansion (CTE) of the material of the first TSV. The process includes forming a first metal contact pad at the first bonding surface and coupled to the first TSV, based on the estimate or based on a volume of the material of the first TSV and a coefficient of thermal expansion (CTE) of the material of the first TSV.

The first metal contact pad is disposed at the first bonding surface (and may be disposed directly over the first TSV), and extends partially into the first substrate below the first bonding surface, electrically coupling the first metal contact pad to the first TSV. In the embodiment, the process includes planarizing the first bonding surface to have a predetermined maximum surface variance for direct bonding, and the first metal contact pad to have a predetermined recess relative to the first bonding surface, based on the volume of the material of the first TSV and the coefficient of thermal expansion (CTE) of the material of the first TSV.

In various examples, selecting or forming the contact pad comprises selecting a diameter or a surface area of the first metal contact pad. For instance, a first metal contact pad may be selected or formed to have an oversized diameter, an oversized surface area, or the like, than typical for a like application. In an embodiment, the process includes determining a desired recess for the first metal contact pad relative to the first bonding surface, to allow for expansion of the material of the first TSV and the material of the first metal contact pad, based on the predicting, and selecting the first metal contact pad to have a perimeter shape likely to result in the desired recess when the first metal contact pad is planarized. This may include forecasting an amount of recess that is likely to occur in a surface of the first metal contact pad as a result of the planarizing. In another embodiment, the process includes forming the desired recess in a surface of the first metal contact pad (prior to bonding), based on the determining.

In various embodiments, the process includes reducing or eliminating delamination of bonded microelectronic components by selecting the first metal contact pad. In an alternate implementation, the process includes recessing or eroding material of the first bonding surface directly around the first metal contact pad to allow for expansion of the material of the first TSV and the material of the first metal contact pad, based on the volume of the material of the first TSV and the coefficient of thermal expansion (CTE) of the material of the first TSV.

Additionally or alternatively, the back side of the first substrate may also be processed for bonding. One or more insulating layers of preselected materials may be deposited on the back side of the first substrate to provide stress relief when the back side of the first substrate is to be direct bonded.

Further, the first TSV, as well as other TSVs within the first substrate may be used to direct or transfer heat within the first substrate and/or away from the first substrate. In some implementations, the thermal transfer TSVs may extend partially or fully through a thickness of the first substrate and may include a thermally conductive barrier layer. In such examples, barrier layers normally used around the TSVs that tend to be thermally insulating may be replaced with thermally conductive layers instead. In various implementations, some TSVs may be used for signal transfer and thermal transfer.

In an embodiment, a microelectronic assembly comprises a first substrate including a first bonding surface with a planarized topography having a first predetermined maximum surface variance. A first through silicon via (TSV) is embedded into the first substrate and a first metal contact pad is disposed at the first bonding surface and is electrically coupled to the first TSV. The first contact pad may be disposed over the first TSV, for instance. The first metal contact pad may be selected or formed based on an estimate of an amount that a material of the first TSV will expand when heated to a preselected temperature and/or based on a volume of the material of the first TSV and a coefficient of thermal expansion (CTE) of the material of the first TSV. A predetermined recess is disposed in a surface of the first metal contact pad, having a volume equal to or greater than an amount of expansion of the material of the first TSV and an amount of expansion of a material of the first metal contact pad when heated to the preselected temperature.

In an implementation, the first metal contact pad is positioned over the first TSV and the first metal contact pad has an oversized diameter or an oversized surface area than a pad typically used for a like application.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

This summary is not intended to give a full description. Implementations are explained in more detail below using a plurality of examples. Although various implementations and examples are discussed here and below, further implementations and examples may be possible by combining the features and elements of individual implementations and examples.

DETAILED DESCRIPTION

Overview

Referring to FIG. 1A (showing a cross-sectional profile view) and FIG. 1B (showing a top view), patterned metal and oxide layers are frequently provided on a die, wafer, or other substrate (hereinafter "die 102") as a hybrid bonding, or DBI®, surface layer. A representative device die 102 may be formed using various techniques, to include a base substrate 104 and one or more insulating or dielectric layers 106. The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like.

A bonding surface 108 of the device wafer 102 can include conductive features 110, such as traces, pads, and interconnect structures, for example, embedded into the insulating layer 106 and arranged so that the conductive features 110 from respective bonding surfaces 108 of opposing devices can be mated and joined during bonding, if desired. The joined conductive features 110 can form continuous conductive interconnects (for signals, power, etc.) between stacked devices.

Damascene processes (or the like) may be used to form the embedded conductive features 110 in the insulating layer 106. The conductive features 110 may be comprised of metals (e.g., copper, etc.) or other conductive materials, or combinations of materials, and include structures, traces, pads, patterns, and so forth. In some examples, a barrier layer may be deposited in the cavities for the conductive features 110 prior to depositing the material of the conductive features 110, such that the barrier layer is disposed between the conductive features 110 and the insulating layer 106. The barrier layer may be comprised of tantalum, for example, or another conductive material, to prevent or reduce diffusion of the material of the conductive features 110 into the insulating layer 106. After the conductive features 110 are formed, the exposed surface of the device wafer 102, including the insulating layer 106 and the conductive features 110 can be planarized (e.g., via CMP) to form a flat bonding surface 108.

Forming the bonding surface 108 includes finishing the surface 108 to meet dielectric roughness specifications and metallic layer (e.g., copper, etc.) recess specifications, to prepare the surface 108 for direct bonding. In other words, the bonding surface 108 is formed to be as flat and smooth as possible, with very minimal surface topology variance. Various conventional processes, such as chemical mechanical polishing (CMP), dry or wet etching, and so forth, may be used to achieve the low surface roughness. This process provides the flat, smooth surface 108 that results in a reliable bond.

In the case of double-sided dies 102, a patterned metal and insulating layer 106 with prepared bonding surfaces 108 may be provided on both sides of the die 102. The insulating layer 106 is typically highly planar (usually to nm-level roughness) with the metal layer (e.g., embedded conductive features) at or recessed just below the bonding surface 108. The amount of recess below the surface 108 of the insulating layer 106 is typically determined by a dimensional tolerance, specification, or physical limitation. The bonding surfaces 108 are often prepared for direct bonding with another die, wafer, or other substrate using a chemical-mechanical polishing (CMP) step and/or other preparation steps.

Some embedded conductive features or interconnect structures may comprise metal pads 110 or conductive traces 112 that extend partially into the dielectric substrate 106 below the prepared surface 108. For instance, some patterned metal (e.g., copper) features 110 or 112 may be about 0.5-2 microns thick. The metal of these features 110 or 112 may expand as the metal is heated during annealing. Other conductive interconnect structures may comprise metal (e.g., copper) through silicon vias (TSVs) 114 or the like, that extend normal to the bonding surface 108, partly or fully through the substrate 102 and include a larger quantity of metal. For instance, a TSV 114 may extend about 50 microns, depending on the thickness of the substrate 102. The metal of the TSV 114 may also expand when heated. Pads 110 and/or traces 112 may or may not be electrically coupled to TSVs 114, as shown in FIG. 1A.

Figure 2:
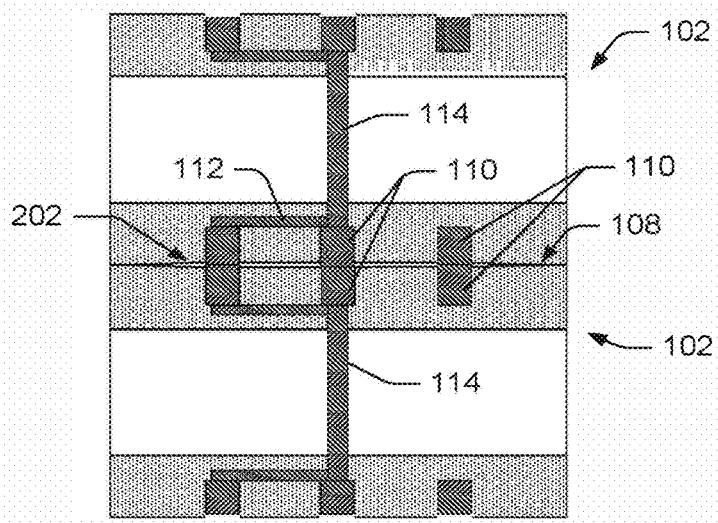
FIG. 2 shows a cross-section of two example bonded substrates with bonding pads and TSVs, and example resulting delamination.

Referring to FIG. 2, dies 102 may be direct bonded, for instance, without adhesive to other dies 102 with metal pads 110, traces 112, and/or TSVs 114. If a metal pad 110 is positioned over a TSV 114 (electrically coupled to the TSV 114), the expansion of the TSV 114 metal can contribute to the expansion of the pad 110 metal. In some cases, the combined metal expansion can cause localized delamination 202 of the bonding surfaces at the location of the TSV 114 (or TSV 114/pad 110 combination), as the expanding metal rises above the bonding surface 108. For instance, the expanded metal can separate the bonded dielectric surfaces 108 of the stacked dies 102.

EXAMPLE EMBODIMENTS

Figure 3A:
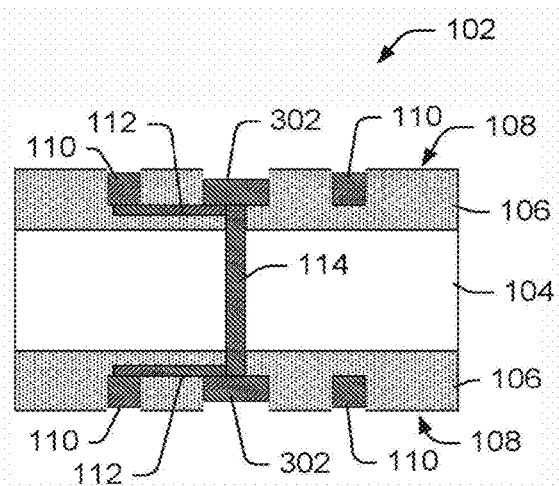
FIG. 3A shows a cross-section of an example substrate with larger bonding pads positioned over the TSV, according to an embodiment.
Figure 3B:
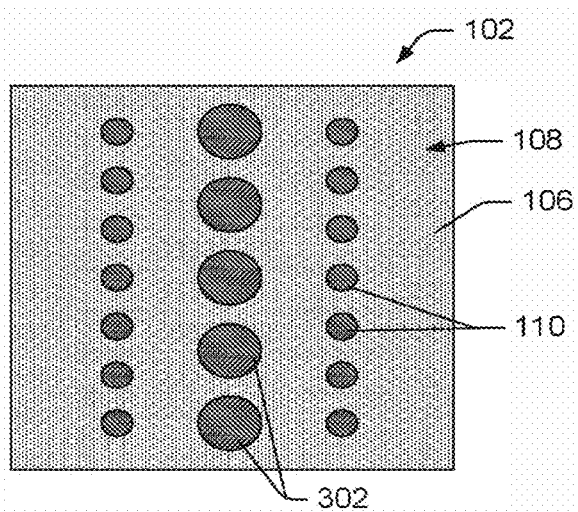
FIG. 3B shows a top view of the example substrate of FIG. 3A, according to an embodiment.
Figure 4:
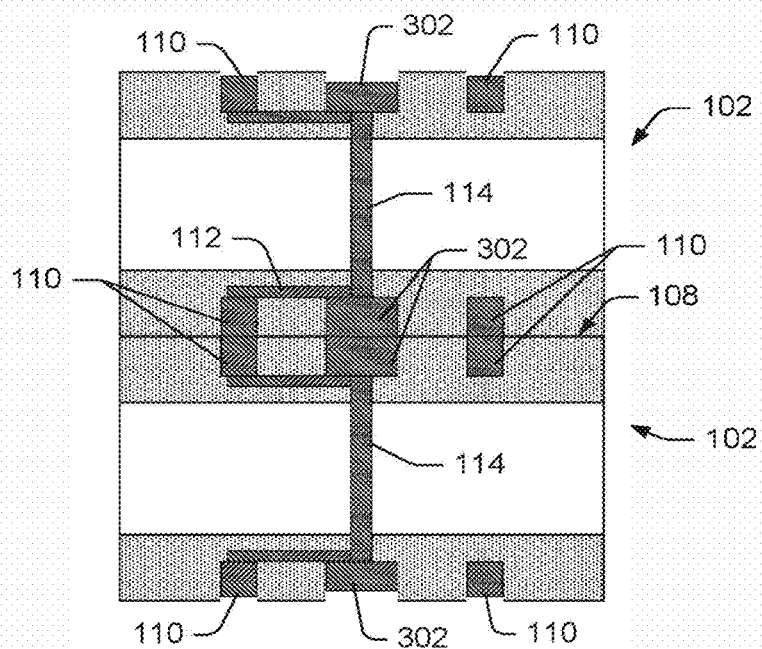
FIG. 4 shows a cross-section of two example bonded substrates with larger bonding pads positioned over the TSV, according to an embodiment.

Referring to FIGS. 3A, 3B, and 4, in various embodiments, techniques may be employed to mitigate the potential for delamination due to metal expansion. For example, in one embodiment, a metal pad 302 having a larger diameter or surface area (e.g., oversized for the application) may be used in place of a contact pad 110 when positioned over a TSV 114. For instance, the pad 302 may have a larger diameter than other contact pads 110 at the surface 108 of the die 102, so that the pad 302 will have a deeper recess, and accordingly thinner metal in a dimension normal to the surface 108, for a given CMP process than the other contact pads 110 that are not positioned over a TSV 114. Similar to the contact pads 110, the contact pad 302 may be embedded in the dielectric layer 106, extending partially into the dielectric layer 106 below the bonding surface 106, and electrically coupled to the TSV 114. For instance, the amount of oversize of the metal pad 302 may be selected based on the material of the pad 302, its thickness, and anticipated recess during CMP processing.

As shown in FIG. 3A (showing a cross-sectional profile view) and FIG. 3B (showing a top view), pads 302 disposed over TSVs 114 may be larger (in area, diameter, etc.), by a preselected amount, than other pads 110 disposed elsewhere at the bonding surface 108 of the die 102 (e.g., not disposed over TSVs 114). In an embodiment, the pads 302 are selected or formed by estimating an amount that the material of the TSV 114 will expand when heated to a preselected temperature)(~300°, based on a volume of the material of the TSV 114 and a coefficient of thermal expansion (CTE) of the material of the TSV 114, and predicting an amount that the material of the contact pad 302 will expand when heated to the preselected temperature, based on a volume of the material of the contact pad 302 and a CTE of the material of the contact pad.

The contact pad 302 is planarized along with the bonding surface 108 of the dielectric layer 106, including recessing the contact pad 302 to have a predetermined recess depth (or amount) relative to the bonding surface 108 based on estimating and predicting the expansion of the TSV 114 material and the contact pad 302 material at the preselected temperature.

Referring to FIG. 4, after preparation of the bonding surface 108 (e.g., by CMP) the dies 102 may be direct bonded, for instance, without adhesive to other dies 102 with metal pads 110 and/or 302, traces 112, and/or TSVs 114. When a metal pad 302 is positioned over a TSV 114, and is recessed a predetermined or predictable amount, the recess provides room for material expansion without delamination. The TSV 114 material and the pad 302 material expand during heated annealing. The mating contact pads 302 (or 302 and 110 in some examples) of opposite dies 102 bond to form a single conductive interconnect. However, the combined metal expansion does not cause delamination of the bonding surfaces since the expanding metal does not exceed the volume formed by the recess(es) in the contact pads 302 (or 302 and 110 in some examples). For instance, if the volume of the recess(es) is sufficient, the expanded metal does not separate the bonded dielectric surfaces 108 of the stacked dies 102, as shown in FIG. 4.

Figure 5:
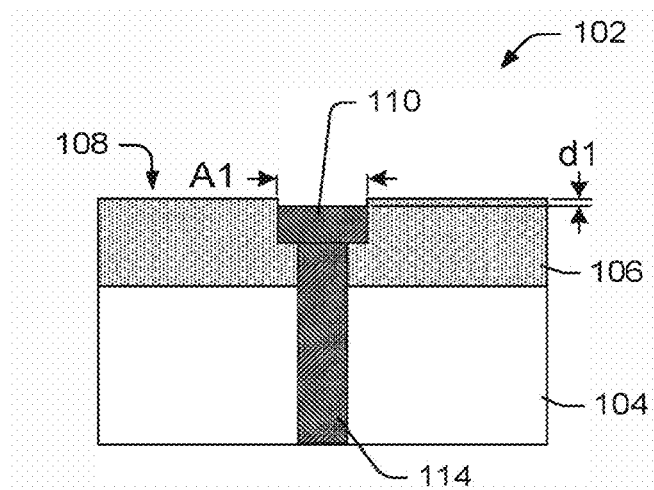
FIG. 5 shows a cross-section of an example substrate with a bonding pad positioned over a TSV, illustrating an example recess of the bonding pad.
Figure 6:
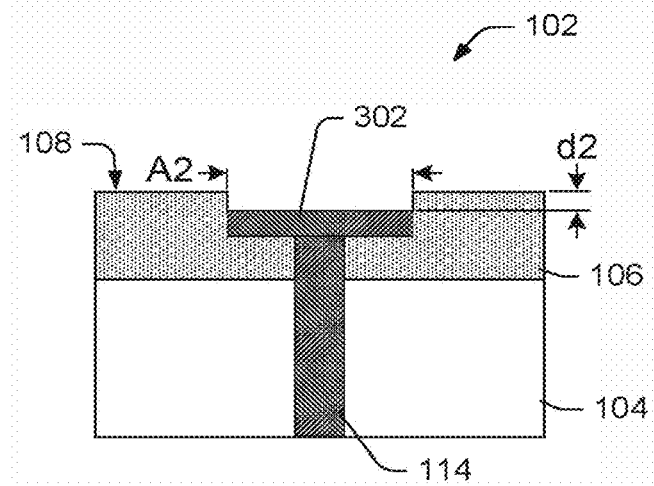
FIG. 6 shows a cross-section of an example substrate with a larger bonding pad positioned over a TSV, illustrating an example recess of the bonding pad, according to an embodiment.

Referring to FIGS. 5 and 6, details of contact pads 110 and 302 over TSVs 114 are illustrated. A portion of a die 102 is shown, first with a contact pad 110 over a TSV 114 (FIG. 5) and then with a contact pad 302 over a TSV 114 (FIG. 6). When using surface preparation processes such as CMP to prepare the bonding surface 108 of the die 102, the metal pads 110 or 302 on the bonding surface 108 can tend to become recessed relative to the dielectric 106, due to the softness of the contact pads 110 or 302 (which may comprise copper, for instance) relative to the dielectric 106 (which may comprise an oxide, for example).

In various embodiments, a contact pad 302 with a larger diameter or surface area A2 than a contact pad 110 with a smaller diameter or surface area A1 (shown at FIGS. 5 and 6, where A2>A1) may become recessed to a greater degree "d2" (e.g., a deeper recess) than the recess "d1" of the smaller diameter pad 110 during a similar CMP process. The deeper recess "d2" can compensate for the combined metal expansion of the pad 302 and the TSV 114, allowing more room for expansion of the metal, and can reduce or eliminate delamination. In some embodiments, the contact pad 302 may be intentionally recessed to the desired depth "d2" and in other embodiments, the contact pad 302 may be selected due to the predictable recess "d2" that results from surface 108 preparation by CMP (or other processing), based on the size (diameter and/or surface area), material composition, etc. of the pad 302.

In various embodiments, the amount of recessing (e.g., d1, d2, etc.) of a metal pad 110 or 302 may be predictable, based on the surface preparation technique used (e.g., the chemical combination used, the speed of the polishing equipment, etc.), the materials of the dielectric layer 106 and the metal pads 110 and 302, the spacing or density of the metal pads 110 and 302, and the size (e.g., area or diameter) of the metal pads 110 and 302. In the embodiments, the area or diameter of the metal pads 110 and 302 may be selected (e.g., for a particular metal thickness) to avoid delamination of bonded dies 102 based on the recess prediction and the expected metal expansion of the TSV 114 and metal pad 110 or 302 combination. For example, larger sized pads 302 may be used over TSVs 114 and smaller sized pads 110 may be used over dielectric 106 (to avoid excessive recessing of these pads 110). This technique can result in reduced or eliminated delamination, as well as dependable mechanical coupling of the dielectric 106 and metal structures (110, 302, 112, and/or 114) on the bonding surfaces 108 and reliable electrical continuity of the bonded metal structures (110, 302, 112, and/or 114).

In one embodiment, a metal pad 110, 302 may be selectively etched (via acid etching, plasma oxidation, etc.) to provide a desired recess depth (to accommodate a predicted metal expansion). In another embodiment, a pad 110, 302 or a corresponding TSV 114 may be selected, formed, or processed to have an uneven top surface as an expansion buffer. For example, referring to FIG. 7, the top surface of the pad 302 (or TSV 114 in some cases) may be formed or selectively etched to be rounded, domed, convex, concave, irregular, or otherwise non-flat to allow room for material expansion.

Figure 7:
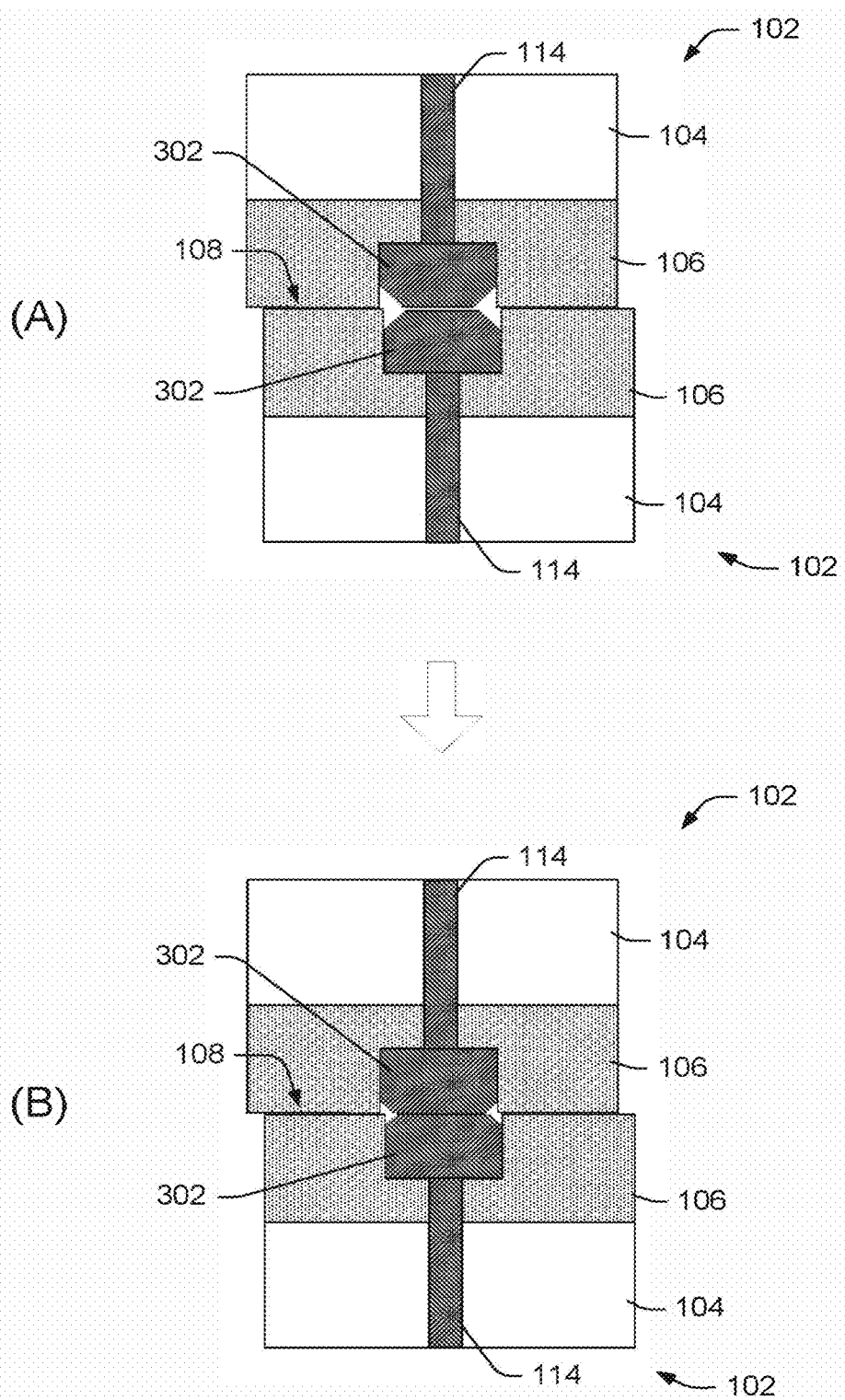
FIG. 7 shows a cross-section of two example bonded substrates with bonded pads having non-flat bonding surfaces, before and after annealing, according to an embodiment.

As shown at FIG. 7 at A, the top or bonding surface of the contact pads 302 are selected, formed, or processed to have an uneven surface. As shown at B, after material expansion due to heated annealing, the pads 302 make contact and are bonded. However, with an adequate space for expansion provided by the uneven top surfaces of the pads 302, the material does not exceed the space provided, and so delamination of the bonded dies 102 does not occur.

Figure 8:
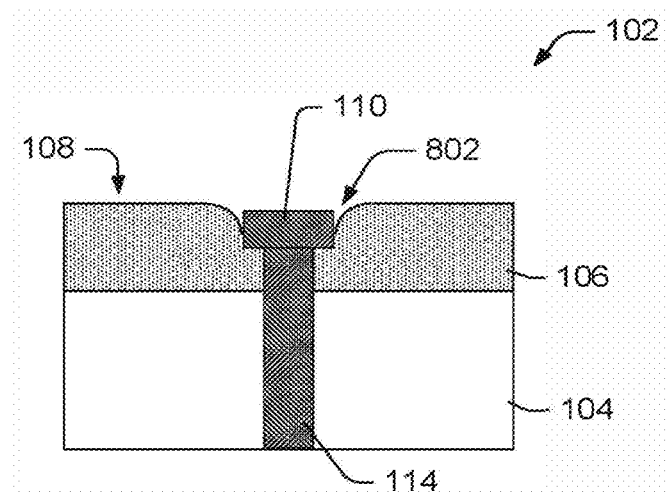
FIG. 8 shows a cross-section of an example substrate with a bonding pad positioned over the TSV, and with erosion or recessing of dielectric around the bonding pad, according to an embodiment.

Additionally or alternatively, as shown in FIG. 8, the dielectric 106 around the metal pad 110 or 302 can be formed or shaped to allow room for the metal of the pad 110 or 302 (and TSV 114) to expand. In one example, a CMP process can be used to shape the surface 108 of the dielectric 106 around the metal pad 302, or in other examples other processes can be used, so that the dielectric 106 around the pad 302 includes a recess 802 or other gap that provides room for metal expansion.

In an embodiment, the dielectric 106 can be recessed (e.g., with CMP) while the bonding surface 108 is being prepared. In the embodiment, the metal pad 110 or 302 and the dielectric 106 may be recessed concurrently (but at different rates). For instance, the process may form erosion 802 in the dielectric 106 around the edges of the metal pad 110 or 302 while recessing the metal pad 110 or 302.

In various embodiments, the pad 110 or 302 and/or the TSV 114 are comprised of copper, a copper alloy, or the like. In a further embodiment, the materials of the pad 110 or 302 and/or the TSV 114 may be varied to control metal expansion and potential resulting delamination. For instance, in some embodiments, the pad 110 or 302 and/or the TSV 114 may be comprised of different conductive materials, perhaps with lower CTEs. In some embodiments the TSV 114 may be comprised of a different conductive material (with a lower CTE) than the contact pad 110 or 302. For example, the TSV 114 may be comprised of tungsten, an alloy, or the like.

In other embodiments the volume of material of the TSV 114 may be varied to control metal expansion and the potential for resulting delamination. For instance, in some embodiments, a TSV 114 with a preselected material volume (e.g., less volume of material) may be used to control delamination, when this is allowable within the design specifications. The preselection of volume of the TSV 114 may be based on predicted material expansion (of the TSV 114 and a contact pad 110 or 302, when applicable).

In an alternate embodiment, the metal contact pad 110 or 302 may be offset or relocated from the TSV 114, rather than being positioned directly over the TSV 114. For instance, the metal pad 110 or 302 may be positioned so that it is not directly over the TSV 114, and be coupled to the TSV 114 by a metal trace 112, or the like, if desired. If the contact pad 110 or 302 is offset from the TSV 114, a cavity may be created to allow the TSV 114 to expand in the z-direction without affecting the bond interface. The cavity may be left open or may be filled with a material, such as a compliant material.

Alternately, the top surface of the TSV 114 can be arranged to be exposed at the bonding surface 108 and used as a contact pad. These arrangements can avoid combining the expansion of the metal pad 110 or 302 with that of the TSV 114, and so minimizing or eliminating delamination.

In a further embodiment, the TSV 114 can be formed so that the TSV 114 extends partially (rather than fully) through the thickness of the substrate 102, terminating below the bonding surface 108. A gap or recess can be provided in the bonding surface 108 over the TSV 114 to allow room for the metal of the TSV 114 to expand, without causing delamination. For instance, the gap can be formed by etching the dialectic layer 106. The gap may or may not expose the TSV 114. The gap can be tuned, for example, to the volume of the TSV 114, using a prediction of the expansion of the TSV 114, based on the volume of the particular metal of the TSV 114.

Additional Embodiments

FIGS. 9-13 illustrate examples of backside die 102 processing, according to various embodiments. In some implementations, where dies 102 are stacked and direct bonded without adhesive, the backside 902 of the die 102 may receive different preparation than the topside bonding surface 108, when the backside 902 is prepared for direct bonding. Instead of forming the dielectric layer 106 on the backside 902 of the die 102, the backside 902 may be prepared differently to reduce process steps, reduce manufacturing costs, or for other reasons.

In one implementation, the backside 902 is prepared so that the backend of the TSV 114 is exposed, to be used as a contact surface for bonding to a conductive pad, interconnect, or other conductive bonding surface. The preparation may include thinning and selectively etching the base substrate 104 to expose the TSV 114 with the liner/barrier layer 904 intact, depositing one or more layers of insulating materials and planarizing (via CMP, for example) the backside 902 to reveal the TSV 114. In some cases, however, the expansion of the material of the TSV 114 during heated annealing can cause the insulating material and/or the substrate 104 to deform and rise above the planarized surface.

In an embodiment, as shown in FIGS. 9-13, one or more layers of material may be deposited on the backside 902 to cover up the raised area so the new surface can be re-planarized for good dielectric-to-dielectric bonding. Another important function of the multi-layer structure is to balance the stress between the front and back side of the die 102 to minimize die warpage prior to bonding. A balanced die 102 is easier to bond and less prone to bonding voids. The added layers of material can be planarized and otherwise prepared as a bonding surface on the backside 902 of the die 102.

Figure 9:
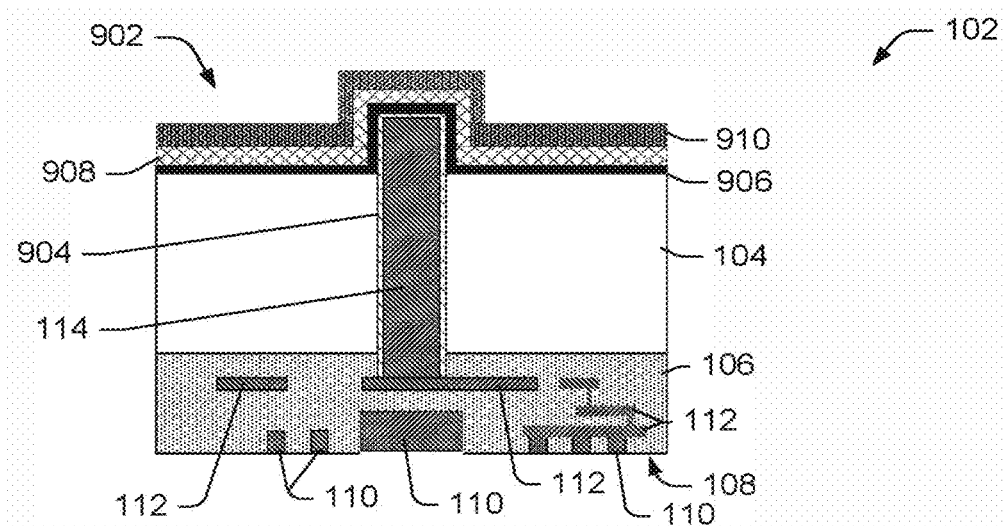
FIGS. 9-13 show a cross-section of an example substrate with a bonding pad positioned over a TSV, illustrating an example backside process of the substrate, according to an embodiment.

As shown at FIG. 9, the TSV 114 is disposed within the die 102, transverse to the bonding surface 108 of the die 102.

The TSV 114 may extend beyond the surface of the base substrate 104 after selective etching of the base substrate 104. A diffusion barrier and oxide liner 904 surrounds the TSV 114 to prevent diffusion of the metal of the TSV 114 (e.g., copper) into the material of the base substrate 104 (e.g., silicon). In an embodiment, as shown at FIG. 9, another diffusion barrier 906 is deposited on the surface of the backside of the die 102. In an example, the diffusion barrier 906 comprises a dielectric, such as a nitride or the like.

In various embodiments, one or more inorganic dielectric layers which may have different residue stress characteristics are then deposited onto the backside 902 of the die 102 to enable proper reveal of the TSV 114 and to balance stress on the device side (front side) of the die 102 to minimize die warpage after singulation. For example, a first layer 908, comprising a first low temperature dielectric, such as an oxide, may be deposited over the backside 902, including the diffusion layer 906.

In some embodiments, a second layer 910, comprising a second low temperature dielectric, such as a second oxide, may be deposited over the backside 902, including the first layer 908. The second oxide layer 910 may have a similar or a different residue stress characteristic than the first layer 908 (for example, the first layer 908 may be compressive and the second layer 910 may be tensile, or vice versa, or both layers 908 and 910 may be compressive or tensile with similar or different values). In various implementations, the first layer 908 and the second 910 layer are comprised of similar or the same materials (in varying thicknesses). In other implementations, the first layer 908 and the second 910 layer are comprised of different materials. In alternate implementations, additional dielectric layers may also be deposited over the first 908 and second 910 layers.

Figure 10:
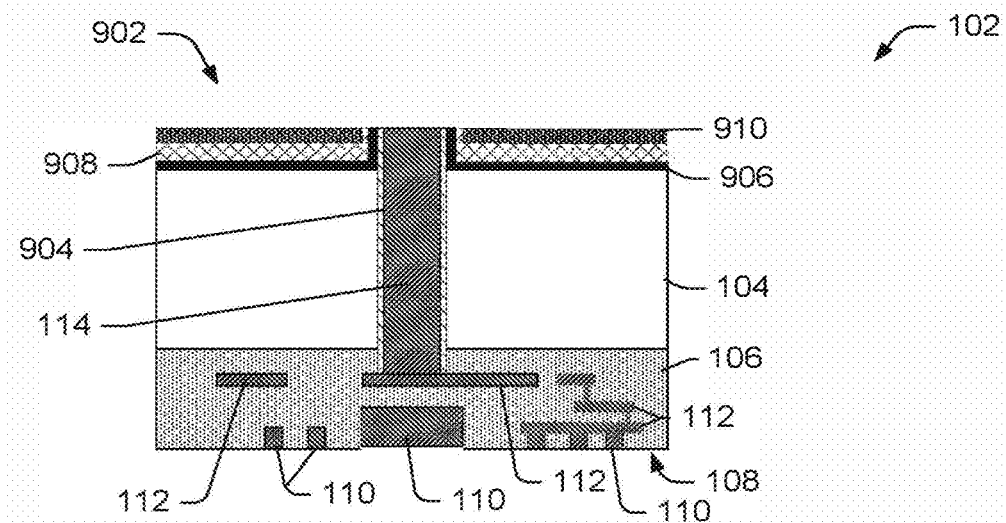

As shown at FIG. 10, the backside 902 is planarized (via CMP, for example), including the one or more stress layers 908 and 910 to form a flat, smooth bonding surface for direct bonding. Part of the second layer 910 may be left on the backside 902 to aid with mitigating damage, such as the oxide ring effect. Additionally, the remaining portion of the second layer 910 can assist with warpage control, based on a residue stress characteristic of the second layer 910.

Figure 11:
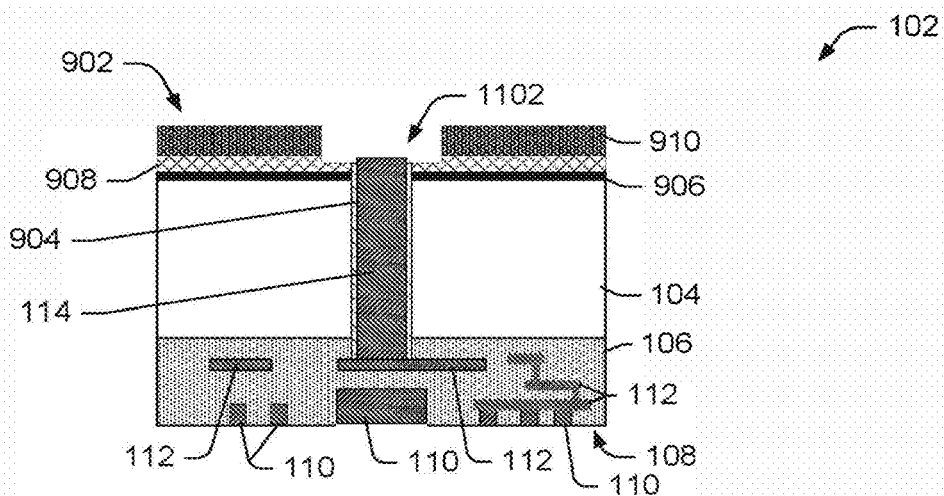
Figure 12:
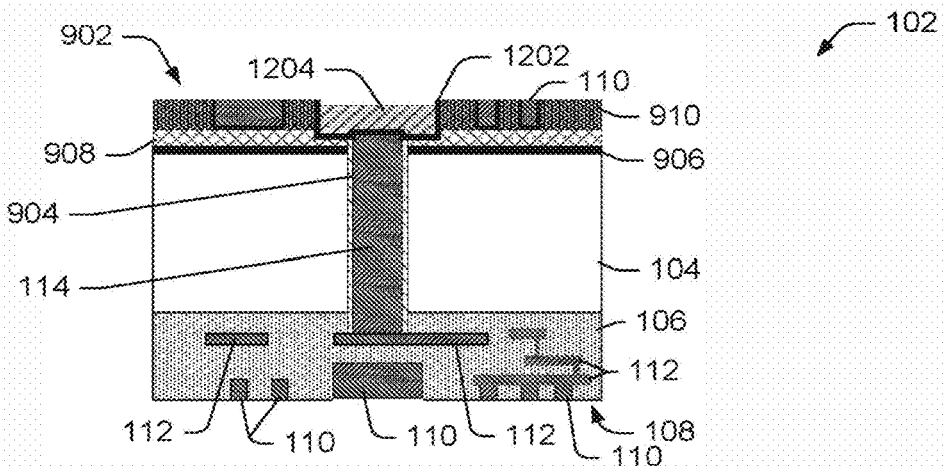

In another embodiment, as shown in FIGS. 11-12, a contact pad 1204 may be coupled to the TSV 114 on the backside 902 of the die 102. As shown at FIG. 11, after deposition of the first dielectric layer (low temperature oxide stress layer 908, for example), which also comprises the bonding layer in some implementations, the TSV 114 is fully exposed and planarized by a process such as CMP. A second dielectric layer 910 (which may comprise an oxide) may be deposited over the first layer 908 and planarized. No barrier or adhesion layer is needed between the two oxide layers (908 and 910). After planarization, the backside 902 is patterned and opened (e.g., etched, etc.) for deposition of a conductive pad. As shown in FIG. 11, the opening 1102 in the oxide layers 908 and 910 may have a larger diameter than that of the TSV 114.

In an embodiment, the opening 1102 for the contact pad 1204 extends through the second layer 910 and partially (10-1000 nm) into the first layer 908. A barrier/adhesion layer 1202 (comprising titanium/titanium nitride, tantalum/tantalum nitride, etc.) may be deposited into the opening 1102 (and may cover the entire surface of the opening 1102), as shown at FIG. 12. A copper (or the like) deposition/plating (e.g., damascene process) fills the opening 1102, which is planarized (via CMP, for example) to remove excess copper and to set the resulting contact pad 1204 recess to a specified depth. The backside 902 surface is prepared for bonding at this point.

Figure 13:
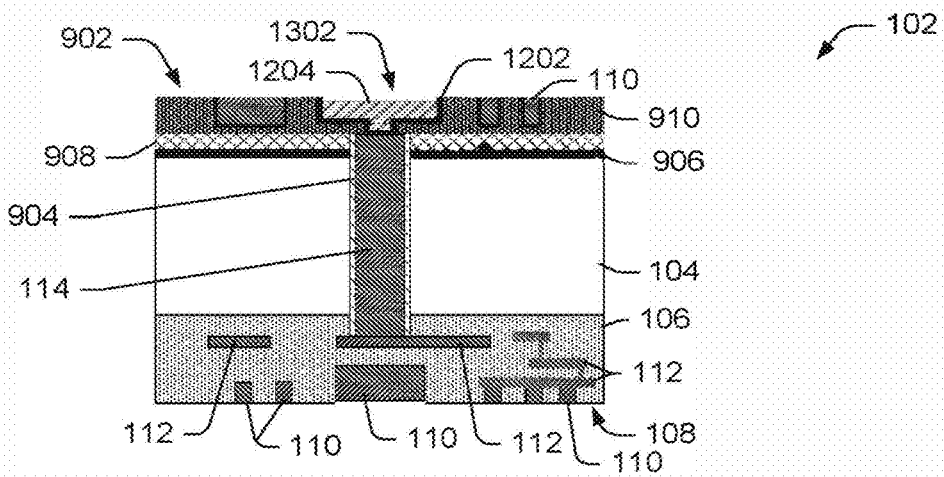

In an alternate embodiment, a dual damascene process may be used to form the contact pad 1204, as shown in FIG. 13. In the embodiment, after depositing the second dielectric layer 910 (which may comprise an oxide) onto the first layer 908 (with no barrier or adhesion layer), the resulting backside 902 surface is patterned twice to form a unique opening 1302 for the contact pad 1204 in a dual damascene process. A first a small opening, with a diameter smaller than the diameter of the TSV 114 is etched partially through the layer 908, then a large opening (larger diameter than the diameter of the TSV 114) over the small opening is patterned and etched, resulting in a smaller opening extending to the TSV 114 and a larger opening partially through layer 910. For instance, in some cases, design rules dictate the presence of a via layer.

A thickness of the second dielectric layer 910 (top layer) and a thickness of the contact pad 1204 may be adjusted to minimize thin die warpage, and to achieve a desired anneal temperature. In other embodiments, alternate techniques may be used to reduce or eliminate delamination due to metal feature expansion, and remain within the scope of the disclosure.

Figure 14:
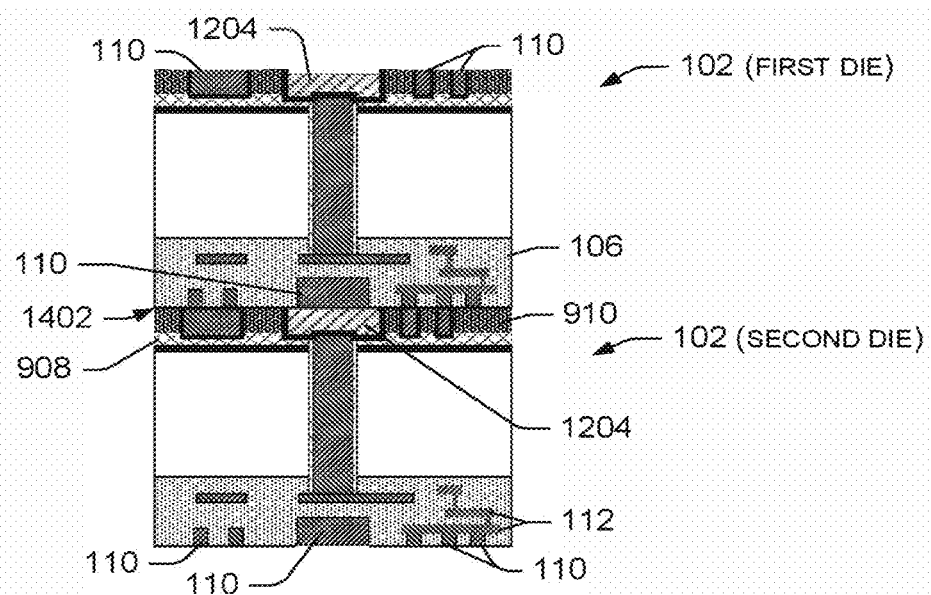
FIG. 14 shows a cross-section of two example bonded substrates with TSVs and bonding pads, bonded front to back, according to an embodiment.
Figure 15:
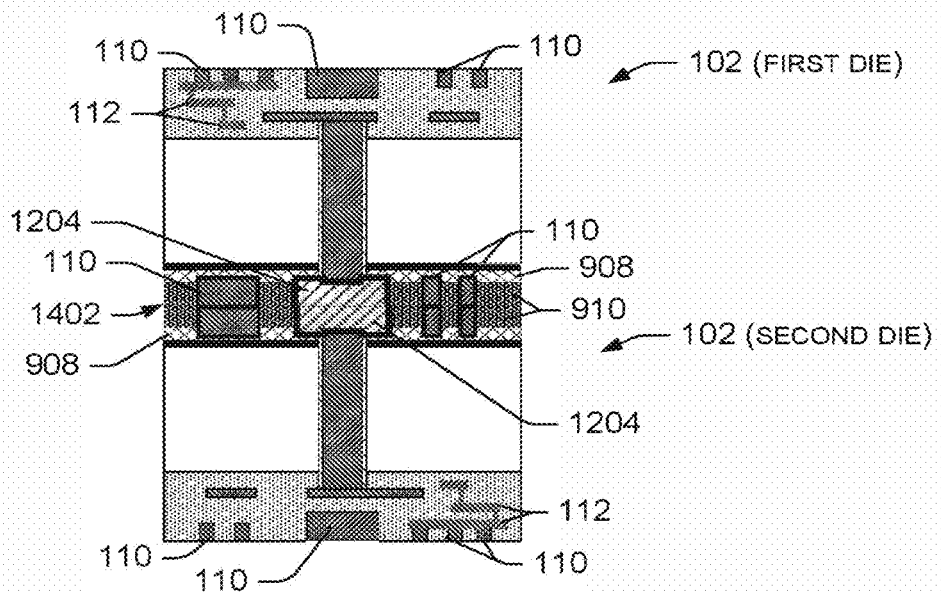
FIG. 15 shows a cross-section of two example bonded substrates with TSVs and bonding pads, bonded back to back, according to an embodiment.
Figure 16:
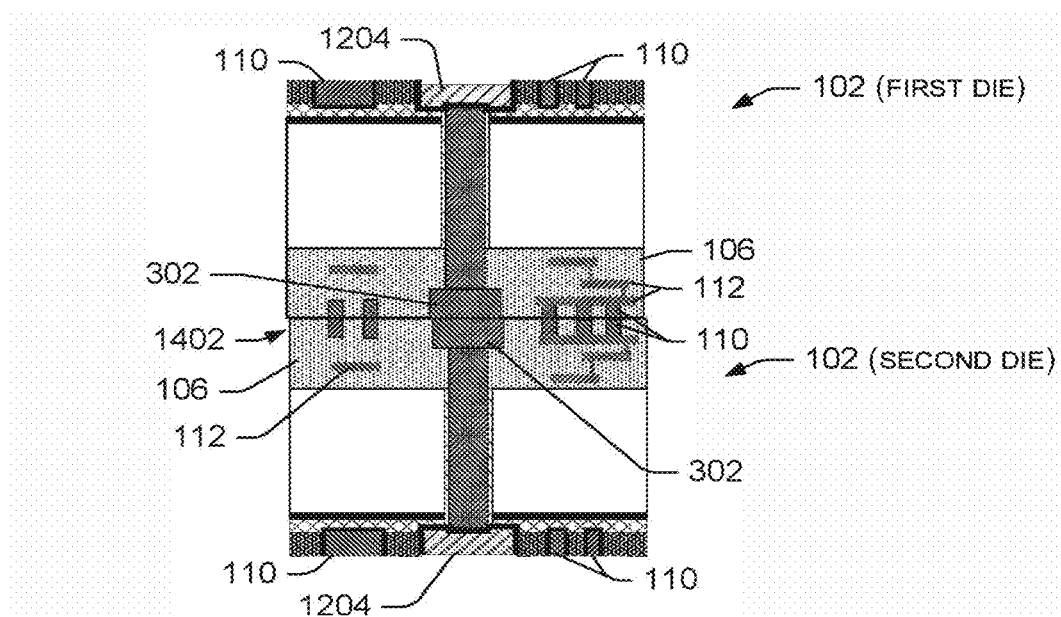
FIG. 16 shows a cross-section of two example bonded substrates with TSVs and bonding pads, bonded front to front, according to an embodiment.

FIGS. 14-16 show example stacking arrangements of the dies 102 formed with regard to FIGS. 9-13 (and like structures) with front side 108 and backside 902 interconnectivity. For example, at FIG. 14, an example "front-to-back" die 102 stack arrangement is shown. This bonds a front side bonding surface 108 of a first die 102 to a backside 902 bonding surface of a second die 102, including a contact pad 110 or 302 of the first die 102 to a contact pad 1204 of the second die 102. In an example, as discussed above, the contact pad 1204 of the second die 102 penetrates into the second dielectric layer 910 and the first dielectric layer 908 of the second die 102, below the bonding interface 1402.

At FIG. 15, an example "back-to-back" die 102 stack arrangement is shown. This bonds a backside 902 bonding surface of a first die 102 to a backside 902 bonding surface of a second die 102, including a contact pad 1204 of the first die 102 to a contact pad 1204 of the second die 102. In an example, as discussed above, the contact pads 1204 of the first and second dies 102 penetrate into the second dielectric layer 910 and the first dielectric layer 908 of the first and second dies 102, below the bonding interface 1402.

At FIG. 16, an example "front-to-front" die 102 stack arrangement is shown. This bonds a front side bonding surface 108 of a first die 102 to a front side bonding surface 108 of a second die 102 at the bonding interface 1402, including a contact pad 110 or 302 of the first die 102 to a contact pad 110 or 302 of the second die 102. In the example shown, the contact pads 110 or 302 are electrically coupled to the TSVs 114 of the respective dies 102.

Figure 17:
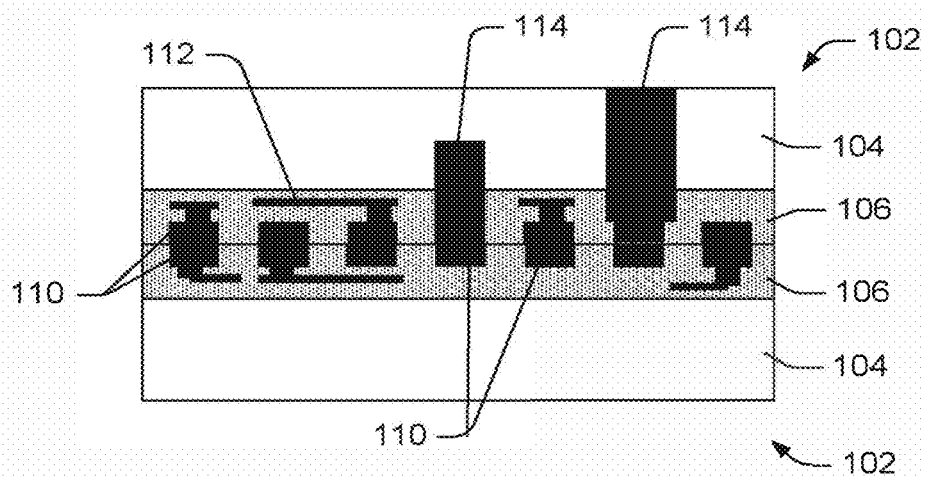
FIG. 17 shows a diagram of example TSVs used for heat management of a die, according to various embodiments.

In various embodiments, as illustrated at FIG. 17, one or more of the TSVs 114 of a set of stacked dies 102 may be used to conduct heat in addition to or instead of electrical signals. For example, in some cases, it may not be practical or possible to attach a heat sink (or other heat transfer device) to a die 102 of a set of stacked dies 102 to alleviate heat generated by the die 102. In such cases, other techniques may be looked—for to transfer heat as desired.

In the embodiments, as shown at FIG. 17, various configurations of TSVs 114, including TSVs that extend partially or fully through a die 102, may be employed to conduct heat away from the dies 102 (or away from a heat-generating portion of the dies 102). The TSVs 114 of one die 102 may be used in conjunction with TSVs 114, contact pads 110 and 302, traces 112, and the like, of the second die 102 to complete heat transfer from one die 102 to the other die 102, and so forth. The TSVs 114 of the first die 102 can be direct bonded (e.g., DBI) to the TSVs 114, contact pads 110 and 302, traces 112, and the like of the second die 102 for high performance thermal conductivity.

In an implementation, some of the TSVs 114, contact pads 110 and 302, traces 112, and the like are electrically floating or "dummy" structures, which can be used for thermal transfer. These structures may conduct heat away from a high power die 102 to another die 102 or substrate as desired. Dummy contact pads 110 or 302 may be coupled to via last or via mid thermal TSVs 114 for thermal conduction.

In the embodiments, diffusion barrier/oxide liner layers 904, which surround the TSVs 114 and can be thermally restrictive or thermal barriers may be replaced by diffusion barrier/oxide liners of a different material having some thermal conductivity (such as metal or alloy barriers, or the like).

Example Process

FIG. 18 illustrates a representative process 1800 for preparing various microelectronic components (such as dies 102, for example) for bonding, such as for direct bonding without adhesive, while reducing or eliminating the potential for delamination due to metal expansion of embedded structures at the bonding surface. For instance, through-silicon vias (TSVs) at the bonding surface may cause delamination, particularly when coupled to contact pads, as the material of the TSVs and the contact pads expands during heated annealing. The process refers to FIGS. 1-18.

The order in which the process is described is not intended to be construed as limiting, and any number of the described process blocks in the process can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein. In alternate implementations, other techniques may be included in the process in various combinations and remain within the scope of the disclosure.

In an implementation, a die, wafer, or other substrate (a "substrate") is formed using various techniques to include a base substrate and one or more dielectric layers. In the implementation, at block 1802, the process 1800 includes embedding a first through silicon via (TSV) (such as TSV 114, for example) into a first substrate (such as die 102, for example) having a first bonding surface (such as bonding surface 108, for example), the first TSV normal to the first bonding surface.

In the implementation, at block 1804, the process includes forming a first metal contact pad (such as contact pad 302, for example) at the first bonding surface and electrically coupled to the first TSV, based on a volume of the material of the first TSV and a coefficient of thermal expansion (CTE) of the material of the first TSV. In an embodiment, the first metal contact pad extends partially into the first substrate below the first bonding surface.

At block 1806, the process includes planarizing the first bonding surface to have a predetermined maximum surface variance for direct bonding and the first metal contact pad to have a predetermined recess relative to the first bonding surface based on the volume of the material of the first TSV and the coefficient of thermal expansion (CTE) of the material of the first TSV. In an implementation, the process includes predicting an amount that a material of the first metal contact pad will expand when heated to a preselected temperature, based on a volume of the material of the first metal contact pad and a CTE of the material of the first metal contact pad, and determining a size of the first metal contact pad based on the estimating combined with the predicting. In one implementation, the process includes selecting a diameter or a surface area of the first metal contact pad.

In an implementation, the process includes electrically coupling the first metal contact pad to the first TSV.

In an implementation, the process includes determining a desired recess for the first metal contact pad relative to the first bonding surface, to allow for expansion of the material of the first TSV and the material of the first metal contact pad, based on the estimating and the predicting; and selecting the first metal contact pad to have a perimeter shape likely to result in the desired recess when the first metal contact pad is planarized.

In another implementation, the process includes determining a desired recess for the first metal contact pad relative to the first bonding surface, to allow for expansion of the material of the first TSV and the material of the first metal contact pad based on the predicting; and forming the desired recess in a surface of the first metal contact pad.

In another implementation, the process includes selecting the first metal contact pad to have an oversized diameter or an oversized surface area than typical for a like application.

In a further implementation, the process includes forecasting an amount of recess that is likely to occur in a surface of the first metal contact pad as a result of the planarizing. In another implementation, the process includes recessing or eroding material of the first bonding surface directly around the first metal contact pad to allow for expansion of the material of the first TSV and a material of the first metal contact pad, based on the estimating.

In an implementation, the process includes reducing or eliminating delamination of bonded microelectronic components by offsetting a position of the first metal contact pad relative to the first TSV so that the first metal contact pad is not disposed directly over the first TSV. In another implementation, the process includes forming a recess in the first bonding surface over the first TSV to allow for expansion of the material of the first TSV. In another implementation, the process includes tuning a volume of the recess in the first bonding surface based on the estimating.

In an implementation, the process includes reducing or eliminating delamination of bonded microelectronic components by extending the first TSV to the first bonding surface and using a top surface of the first TSV as a contact pad at the first bonding surface.

In various embodiments, some process steps may be modified or eliminated, in comparison to the process steps described herein.

The techniques, components, and devices described herein are not limited to the illustrations of FIGS. 1-18, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method of forming a microelectronic assembly, comprising:
   providing a first through substrate via (TSV) in a first substrate having a first surface;
   forming a first metal contact pad in the first surface electrically coupled to and aligned over the first TSV;
   forming a second metal contact pad in the first surface, the second metal contact pad having no TSV aligned thereunder, wherein the second metal contact pad has a different structure from the first metal contact pad to allow greater expansion of the TSV and first metal contact pad relative to the second metal contact pad; and
   treating the first surface, the first metal contact pad and the second metal contact pad to form a first bonding surface for direct hybrid bonding.

2. The method of claim 1, wherein the second metal contact pad is thicker in a dimension normal to the first bonding surface than the first metal contact pad.

3. The method of claim 2, wherein the second metal contact pad has a smaller surface area at the first bonding surface than the first metal contact pad.

4. The method of claim 2, wherein treating the first surface, the first metal contact pad and the second metal contact pad to form the first bonding surface for direct hybrid bonding comprises chemical mechanical planarization.

5. The method of claim 1, wherein treating the first surface, the first metal contact pad and the second metal contact pad to form the first bonding surface for hybrid direct bonding comprises recessing the first metal contact pad from a dielectric surface of the first bonding surface to a greater degree than recessing the second metal contact pad from the dielectric surface to leave the second metal contact pad thicker than the first metal contact pad.

6. The method of claim 5, wherein recessing the first metal contact pad from the first surface to a greater degree than recessing the second metal contact pad from the first surface comprises chemical mechanical planarization.

7. The method of claim 1, wherein the first metal contact pad has an uneven top surface to provide greater volume for thermal expansion relative to the second metal contact pad.

8. The method of claim 1, further comprising:
   providing a second substrate having a second bonding surface including a plurality of conductive interconnects;
   direct hybrid bonding the first bonding surface of the first substrate to the second bonding surface of the second substrate without intervening adhesive, including directly bonding the first metal contact pad and the second metal contact pad to corresponding conductive interconnects of the second substrate.

9. The method of claim 8, wherein direct hybrid bonding comprises heating the first and second substrates to expand the first metal contact pad and the second metal contact pad into electrical and physical contact with the corresponding conductive interconnects of the second substrate.

10. A microelectronic assembly, comprising:
    a first substrate comprising a first through substrate via (TSV) and a first bonding surface configured for direct hybrid bonding;
    a first metal contact pad at the first bonding surface, the first metal contact pad aligned with and in electrical contact with the first TSV; and
    a second metal contact pad at the first bonding surface, the second metal contact pad not aligned with any TSV in the first substrate, wherein the first metal contact pad is thinner in a dimension normal to the first bonding surface compared to the second metal contact pad,
    wherein the first metal contact pad is recessed by a first recess depth from an upper insulating surface of the first bonding surface;
    the second metal contact pad is recessed by a second recess depth from the upper insulating surface of the first bonding surface; and
    the first recess depth is greater than the second recess depth.

11. The microelectronic assembly of claim 10, wherein the first metal contact pad is positioned directly over the first TSV.

12. The microelectronic assembly of claim 10, wherein the first metal contact pad has a larger surface area than the second metal contact pad.

13. The microelectronic assembly of claim 10, where the first substrate includes a second bonding surface on a side opposite the first bonding surface.

* * * * *